US011697187B2

United States Patent
Wu et al.

(10) Patent No.: US 11,697,187 B2
(45) Date of Patent: Jul. 11, 2023

(54) TEMPERATURE-BASED ASSYMETRY CORRECTION DURING CMP AND NOZZLE FOR MEDIA DISPENSING

(71) Applicant: Applied Materials, Inc., Santa Clara, CA (US)

(72) Inventors: Haosheng Wu, San Jose, CA (US); Shou-Sung Chang, Mountain View, CA (US); Jianshe Tang, San Jose, CA (US); Chih Chung, San Jose, CA (US); Hui Chen, San Jose, CA (US); Hari Soundararajan, Sunnyvale, CA (US); Benjamin Cherian, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 283 days.

(21) Appl. No.: 16/849,912

(22) Filed: Apr. 15, 2020

(65) Prior Publication Data
US 2020/0331117 A1 Oct. 22, 2020

Related U.S. Application Data

(60) Provisional application No. 62/836,007, filed on Apr. 18, 2019.

(51) Int. Cl.
*B24B 1/00* (2006.01)
*B24B 57/02* (2006.01)
(Continued)

(52) U.S. Cl.
CPC ............ *B24B 57/02* (2013.01); *B24B 37/015* (2013.01); *B24B 37/042* (2013.01);
(Continued)

(58) Field of Classification Search
CPC ...... B24B 57/02; B24B 37/042; B24B 53/017
(Continued)

(56) References Cited

U.S. PATENT DOCUMENTS

| 5,873,769 A | * | 2/1999 | Chiou | ..................... B24B 37/12 451/36 |
| 6,116,987 A | | 9/2000 | Kubo | |

(Continued)

FOREIGN PATENT DOCUMENTS

| CN | 207171777 | * | 4/2018 | ............. B24B 37/00 |
| JP | H09-123057 | | 5/1997 | |

(Continued)

OTHER PUBLICATIONS

International Search Report and Written Opinion in International Appln. No. PCT/US2020/028330, dated Jul. 28, 2020, 11 pages.
(Continued)

*Primary Examiner* — Joseph J Hail
*Assistant Examiner* — Shantese L McDonald
(74) *Attorney, Agent, or Firm* — Fish & Richardson P.C.

(57) ABSTRACT

A chemical mechanical polishing apparatus includes a rotatable platen to hold a polishing pad, a rotatable carrier to hold a substrate against a polishing surface of the polishing pad during a polishing process, a polishing liquid supply port to supply a polishing liquid to the polishing surface, a thermal control system including a movable nozzle to spray a medium onto the polishing surface to adjust a temperature of a zone on the polishing surface, an actuator to move the nozzle radially relative to an axis of rotation of the platen, and a controller configured to coordinate dispensing of the medium from the nozzle with motion of the nozzle across the polishing surface.

14 Claims, 6 Drawing Sheets

(51) Int. Cl.
  *H01L 21/304* (2006.01)
  *B24B 37/04* (2012.01)
  *B24B 37/015* (2012.01)
  *B24B 37/10* (2012.01)
  *B24B 37/22* (2012.01)
  *B24B 37/34* (2012.01)
  *B24B 55/02* (2006.01)
  *B24B 53/017* (2012.01)
  *B24B 49/14* (2006.01)

(52) U.S. Cl.
  CPC ............ *B24B 37/105* (2013.01); *B24B 37/22* (2013.01); *B24B 37/34* (2013.01); *B24B 55/02* (2013.01); *H01L 21/304* (2013.01); *B24B 49/14* (2013.01); *B24B 53/017* (2013.01)

(58) Field of Classification Search
  USPC .................... 451/56, 7, 36, 41, 53, 287, 288
  See application file for complete search history.

(56) References Cited

U.S. PATENT DOCUMENTS

| | | | |
|---|---|---|---|
| 6,139,406 A * | 10/2000 | Kennedy | B24B 37/04 |
| | | | 451/283 |
| 6,273,806 B1 | 8/2001 | Bennett et al. | |
| 6,315,635 B1 | 11/2001 | Lin | |
| 7,052,374 B1 * | 5/2006 | Lu | B24B 37/04 |
| | | | 451/60 |
| 7,335,088 B1 | 2/2008 | Hwang et al. | |
| 9,579,768 B2 * | 2/2017 | Motoshima | B24B 49/14 |
| 9,630,295 B2 | 4/2017 | Peng et al. | |
| 9,782,870 B2 | 10/2017 | Maruyama et al. | |
| 10,058,975 B2 | 8/2018 | Brown | |
| 11,007,621 B2 | 5/2021 | Sotozaki et al. | |
| 2003/0104769 A1 * | 6/2003 | Brunelli | B24B 53/017 |
| | | | 451/28 |
| 2005/0136804 A1 | 6/2005 | Miyake et al. | |
| 2005/0211377 A1 | 9/2005 | Chen et al. | |
| 2007/0135020 A1 * | 6/2007 | Nabeya | B24B 37/015 |
| | | | 451/7 |
| 2007/0238395 A1 | 10/2007 | Kimura et al. | |
| 2008/0125019 A1 | 5/2008 | Jiang | |
| 2008/0311823 A1 | 12/2008 | Aiyoshizawa et al. | |
| 2010/0015894 A1 | 1/2010 | Ho et al. | |
| 2010/0081360 A1 | 4/2010 | Xu et al. | |
| 2010/0151771 A1 | 6/2010 | Nabeya | |
| 2010/0279435 A1 | 11/2010 | Xu et al. | |
| 2011/0081832 A1 | 4/2011 | Nakamura et al. | |
| 2011/0159782 A1 | 6/2011 | Sone et al. | |
| 2012/0034846 A1 | 2/2012 | Minamihaba et al. | |
| 2012/0190273 A1 | 7/2012 | Ono et al. | |
| 2014/0020829 A1 | 1/2014 | Hung et al. | |
| 2015/0196988 A1 | 7/2015 | Watanabe et al. | |
| 2017/0232572 A1 | 8/2017 | Brown | |
| 2018/0056477 A1 | 3/2018 | Butterfield et al. | |
| 2018/0222007 A1 | 8/2018 | Motoshima et al. | |
| 2018/0236630 A1 | 8/2018 | Yasuda et al. | |
| 2018/0236631 A1 | 8/2018 | Eto et al. | |
| 2018/0290263 A1 | 10/2018 | Sotozaki et al. | |
| 2019/0143476 A1 | 5/2019 | Wu et al. | |
| 2020/0331114 A1 | 10/2020 | Wu et al. | |

FOREIGN PATENT DOCUMENTS

| | | |
|---|---|---|
| JP | H10-156708 | 6/1998 |
| WO | WO 2014-018027 | 1/2014 |

OTHER PUBLICATIONS

Office Action in Taiwanese Appln. No. 109111419, dated Oct. 15, 2021, 8 pages (with English Search Report).

\* cited by examiner

TEMPERATURE-BASED ASSYMETRY CORRECTION DURING CMP AND NOZZLE FOR MEDIA DISPENSING

CROSS-REFERENCE TO RELATED APPLICATIONS

This application claims priority to U.S. Provisional Application Ser. No. 62/836,007, filed on Apr. 18, 2019, the disclosure of which is incorporated by reference.

TECHNICAL FIELD

The present disclosure relates to chemical mechanical polishing (CMP), and more specifically to temperature control during chemical mechanical polishing.

BACKGROUND

An integrated circuit is typically formed on a substrate by the sequential deposition of conductive, semiconductive, or insulative layers on a semiconductor wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate. As another example, a dielectric layer can be deposited over a patterned conductive layer, and then planarized to enable subsequent photolithographic steps.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing slurry with abrasive particles is typically supplied to the surface of the polishing pad.

SUMMARY

In one aspect, a chemical mechanical polishing apparatus includes a platen to hold a polishing pad, a rotatable carrier to hold a substrate against a polishing surface of the polishing pad during a polishing process, a thermal control system including a plurality of independently controllable heaters and/or coolers to independently control temperatures of a plurality of zones on the polishing pad, and a controller. The carrier is laterally movable by a first actuator across the polishing pad and rotatable by a second actuator The controller is configured to cause the thermal control system to generate a first zone having a first temperature and a second zone having a different second temperature, and to control the first actuator and the second actuator to synchronize lateral oscillation of the carrier head with rotation of the carrier head such that over a plurality of successive oscillations of the carrier head when a first angular swath of an edge portion of the substrate is at an azimuthal angular position about the axis of rotation of the carrier head the first angular swath overlies the first zone and when a second angular swath of the edge portion of the substrate is at the azimuthal angular position the second swath overlies the second zone.

Implementations may include one or more of the following features.

The platen may be rotatable. The first zone and second zone may be concentric rings about an axis of rotation of the platen. The actuator may be configured to oscillate the carrier along a radius of the platen. The azimuthal angular position may be an outermost position of the substrate relative to the axis of rotation of the platen.

The controller may be configured to control the first actuator and the second actuator to synchronize lateral oscillation of the carrier head with rotation of the carrier head such that over a plurality of successive oscillations of the carrier head when a third angular swath of an edge portion of the substrate is at the azimuthal angular position, the third angular swath overlies a third zone.

The thermal control system may include a nozzle to spray a medium onto the zone to adjust the temperature of the zone. The thermal control system may include the heater and the medium may be a gas. The thermal control system may include the cooler and the medium may be a liquid.

In another aspect, a chemical mechanical polishing apparatus includes a rotatable platen rotatable by a motor to hold a polishing pad, a carrier to hold a substrate against a polishing surface of the polishing pad during a polishing process, a thermal control system including a plurality of independently controllable heaters and coolers to independently control temperatures of a zone on the polishing pad, and a controller. The controller is configured to cause the thermal control system to alternate between heating and cooling a zone of polishing pad as the zone of the polishing pad rotates below the heaters and coolers so as generate alternating first and second regions of different temperatures, the controller further configured to control the motor and the thermal control system to synchronize heating and cooling of the zone of the polishing pad with rotation of the carrier head such that over a plurality of successive rotations of the carrier head when a first angular swath of an edge portion of the substrate is at an azimuthal angle about the axis of rotation of the carrier head the first angular swath overlies the first region and when a second angular swath of the edge portion of the substrate is at the azimuthal angle about the axis of rotation of the carrier head the second swath overlies the second region.

Implementations may include one or more of the following features.

The zone may be a ring concentric with an axis of rotation of the platen. The alternating first and second regions may be arcuate segments along the ring. An actuator may be is configured to hold the carrier stationary while heating and cooling of the zone of the polishing pad is synchronized with rotation of the carrier head during. The azimuthal angular position may be an outermost position of the substrate relative to the axis of rotation of the platen.

The controller may be configured to control the motor and the thermal control system to synchronize heating and cooling of the zone of the polishing pad with rotation of the carrier head such that such that over a plurality of successive oscillations of the carrier head when a third angular swath of an edge portion of the substrate is at the azimuthal angular position, the third angular swath of the edge portion of the substrate overlies a third region of the zone.

The thermal control system may include a nozzle to spray a medium onto the zone to adjust the temperature of the zone. The thermal control system may include the heater and the medium may be a gas. The thermal control system may include the cooler and the medium may be a liquid.

In another aspect, a chemical mechanical polishing apparatus includes a platen to hold a polishing pad, a carrier laterally movable by an actuator across the polishing pad to hold a substrate against a polishing surface of the polishing pad during a polishing process, a thermal control system including a plurality of independently controllable heaters and coolers to independently control temperatures of a plurality of zones on the polishing pad, and a controller configured to cause the thermal control system to generate a first zone having a first temperature and a second zone having a different second temperature on the polishing pad.

In another aspect, a chemical mechanical polishing apparatus includes a platen to hold a polishing pad, a rotatable carrier to hold a substrate against a polishing surface of the polishing pad during a polishing process, a polishing liquid supply port to supply a polishing liquid to the polishing surface, a thermal control system including a movable nozzle to spray a medium onto the polishing surface to adjust a temperature of a zone on the polishing surface, an actuator to move the nozzle radially relative to an axis of rotation of the platen; and a controller configured to coordinate dispensing of the medium from the nozzle with motion of the nozzle across the polishing surface.

Implementations may include one or more of the following features.

The controller may be configured to coordinate dispensing of the medium so as to reduce asymmetrical polishing of the substrate. The thermal control system may include a heater and the medium may be a heated gas, and/or the thermal control system may include a cooler and the medium may be a cooled liquid. The nozzle may be suspended from an arm, and the arm may be supported by a rotatable base so as to pivot the arm over the polishing surface, or the arm may be extendable and retractable by an actuator, or the nozzle may be linearly movable along the arm In another aspect, a chemical mechanical polishing apparatus includes a platen to hold a polishing pad, a rotatable carrier to hold a substrate against a polishing surface of the polishing pad during a polishing process, a thermal control system including one or more independently controllable heaters and/or coolers to independently control temperatures of at least one zone of a plurality of zones on the polishing pad relative to another zone of the plurality of zones, and a controller configured to configured to coordinate dispensing of the medium with motion of the substrate relative to the polishing pad so as to reduce asymmetrical polishing of the substrate.

Implementations may include one or more of the following features.

The thermal control system may include a plurality of heaters arranged at different radial positions from an axis of rotation of the platen. The plurality of heaters may be suspended from a first arm that extends laterally over the polishing pad. The thermal control system may include a plurality of coolers arranged at different radial positions from an axis of rotation of the platen. The plurality of coolers may be suspended from an arm, e.g., a separate second arm, that extends laterally over the polishing pad. The thermal control system may include a movable nozzle to spray a medium onto the polishing surface. The thermal control system may include a heater and the medium may be a heated gas, and/or the thermal control system may include a cooler and the medium may be a cooled liquid.

Possible advantages may include, but are not limited to, one or more of the following. The polishing profile of the polishing pad can be controlled by quickly and efficiently raising or lowering the temperature of different zones of the polishing pad. Temperature variation over a polishing operation can be controlled to provide a polishing profile that results in a desired wafer profile. This can improve wafer-to-wafer uniformity and improve repeatability of the polishing process. Additionally, temperature variations can be used to improve within-wafer uniformity by providing an in-situ way to correct wafer edge asymmetry during the polishing process.

The details of one or more implementations are set forth in the accompanying drawings and the description below. Other aspects, features, and advantages will be apparent from the description and drawings, and from the claims.

DETAILED DESCRIPTION

In chemical mechanical polishing, removal rates at the edge portion of the substrate can be different from removal rates at the central portion of the substrate. In addition, the polishing rate along the circumference of the substrate need not be uniform; this effect can be termed "edge asymmetry." To address the irregularity in substrate thickness, a substrate could be transported to a dedicated polishing "touch up" tool that can polish local regions on the substrate. Such a tool can be used to correct substrate edge asymmetry. For example, after the polishing process is completed, thicker regions at the edge of the substrate can be locally polished to provide a uniformly thick substrate. However, the throughput for such tools is low.

A technique that could address this problem is to have a dedicated temperature control system that can provide an in-situ correction of the substrate edge asymmetry during the chemical mechanical polishing process. The temperature control system can create zones with different temperatures that provide different polishing rates, as the polishing rate of the polishing pad can be dependent on temperature.

Figure 1:
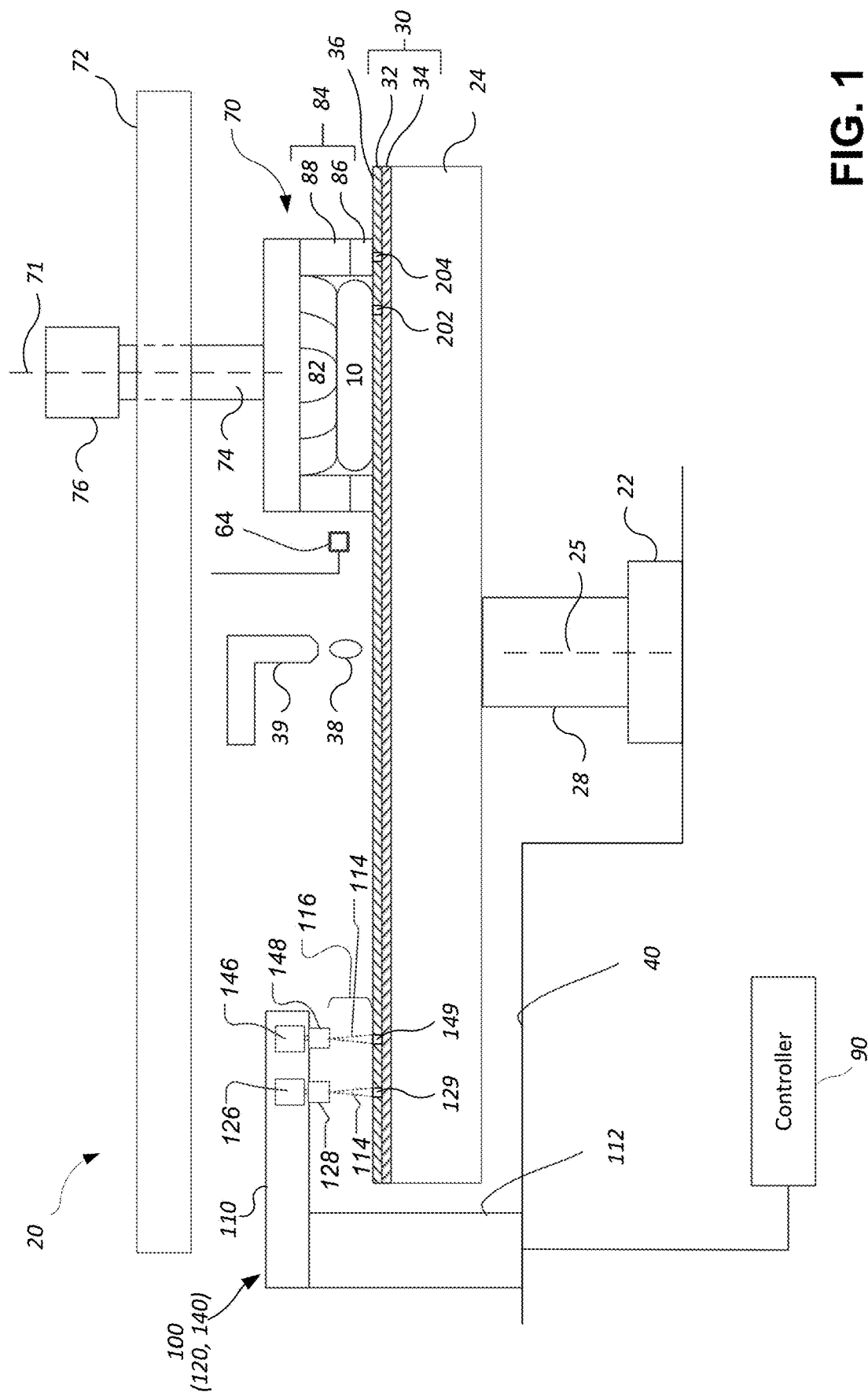
FIG. 1 illustrates a schematic cross-sectional view of an example of a chemical mechanical polishing apparatus.
Figure 2A:
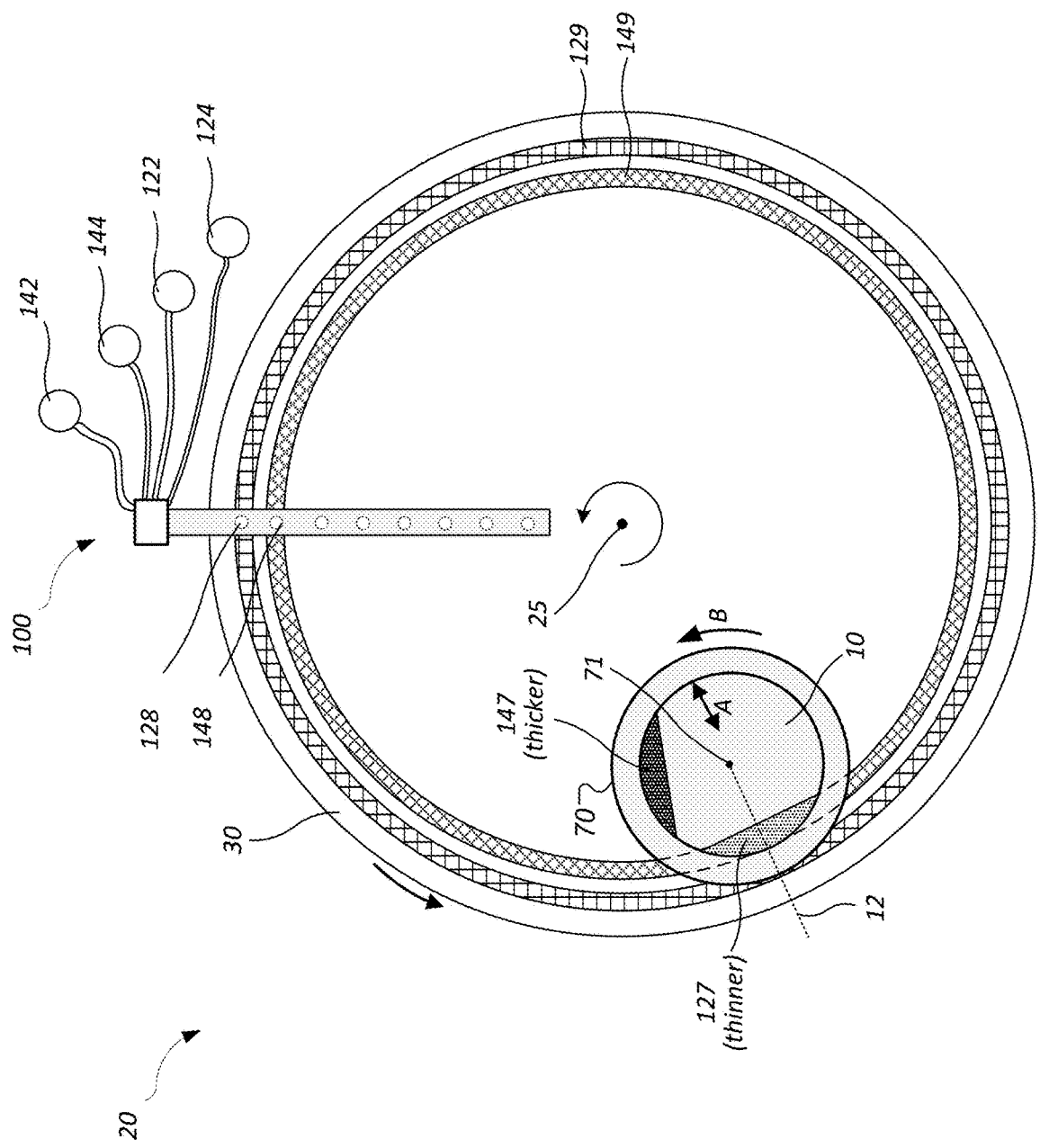
FIGS. 2A and 2B illustrate schematic top views of an example chemical mechanical polishing apparatus.
Figure 2B:
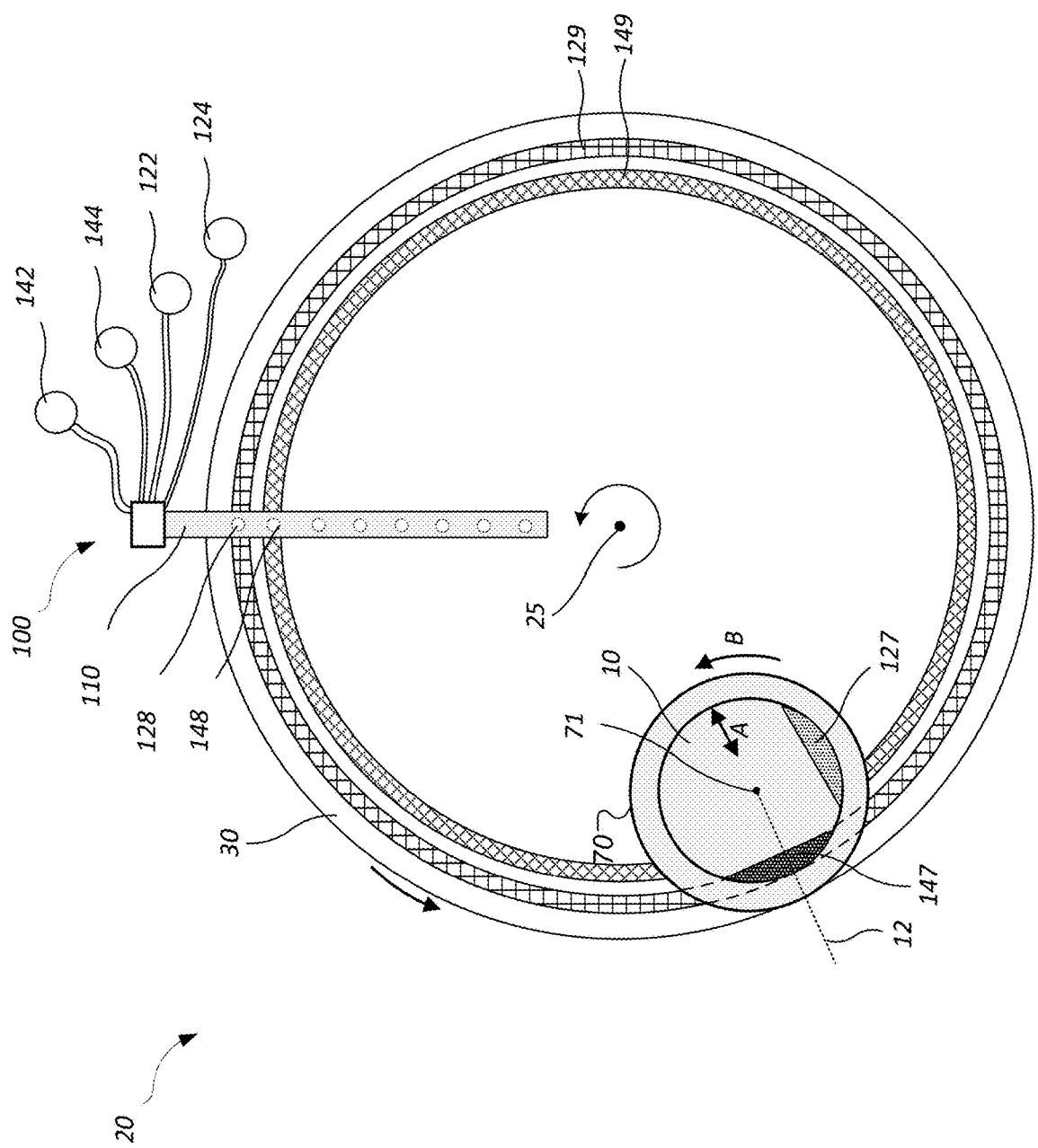

FIGS. 1, 2A and 2B illustrate an example of a polishing station 20 of a chemical mechanical polishing system. The polishing station 20 includes a rotatable disk-shaped platen 24 on which a polishing pad 30 is situated. The platen 24 is operable to rotate about an axis 25. For example, a motor 22 can turn a drive shaft 28 to rotate the platen 24. The polishing pad 30 can be a two-layer polishing pad with an outer polishing layer 34 and a softer backing layer 32.

The polishing station 20 can include a supply port, e.g., at the end of a slurry supply arm 39, to dispense a polishing liquid 38, such as an abrasive slurry, onto the polishing pad 30. The polishing station 20 can include a pad conditioner apparatus with a conditioning disk to maintain the surface roughness of the polishing pad 30. The conditioning disk can be positioned at the end of an arm that can swing so as to sweep the disk radially across the polishing pad 30.

A carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by rotational oscillation of the carousel itself.

The carrier head 70 can include a retaining ring 84 to hold the substrate. In some implementations, the retaining ring 84 may include a lower plastic portion 86 that contacts the polishing pad, and an upper portion 88 of a harder material.

In operation, the platen is rotated about its central axis 25, and the carrier head is rotated about its central axis 71 and translated laterally across the top surface of the polishing pad 30.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head can also include a retaining ring 84 to hold the substrate.

In some implementations, the polishing station 20 includes a temperature sensor 64 to monitor a temperature in the polishing station or a component of/in the polishing station, e.g., the temperature of the polishing pad and/or slurry on the polishing pad. For example, the temperature sensor 64 could be an infrared (IR) sensor, e.g., an IR camera, positioned above the polishing pad 30 and configured to measure the temperature of the polishing pad 30 and/or slurry 38 on the polishing pad. In particular, the temperature sensor 64 can be configured to measure the temperature at multiple points along the radius of the polishing pad 30 in order to generate a radial temperature profile. For example, the IR camera can have a field of view that spans the radius of the polishing pad 30.

In some implementations, the temperature sensor is a contact sensor rather than a non-contact sensor. For example, the temperature sensor 64 can be thermocouple or IR thermometer positioned on or in the platen 24. In addition, the temperature sensor 64 can be in direct contact with the polishing pad.

In some implementations, multiple temperature sensors could be spaced at different radial positions across the polishing pad 30 in order to provide the temperature at multiple points along the radius of the polishing pad 30. This technique could be use in the alternative or in addition to an IR camera.

Although illustrated in FIG. 1 as positioned to monitor the temperature of the polishing pad 30 and/or slurry 38 on the pad 30, the temperature sensor 64 could be positioned inside the carrier head 70 to measure the temperature of the substrate 10. The temperature sensor 64 can be in direct contact (i.e., a contacting sensor) with the semiconductor wafer of the substrate 10. In some implementations, multiple temperature sensors are included in the polishing station, e.g., to measure temperatures of different components of/in the polishing station.

The polishing system 20 also includes a temperature control system 100 to control the temperature of the polishing pad 30 and/or slurry 38 on the polishing pad. The temperature control system 100 operates by delivering a temperature-controlled medium, e.g., a liquid, vapor or spray, onto the polishing surface 36 of the polishing pad 30 (or onto a polishing liquid that is already present on the polishing pad).

As shown in FIGS. 1 and 2, the temperature control system 120 includes an arm 110 that extends over the platen 24 and polishing pad 30 from an edge of the polishing pad to or near the center of the polishing pad 30. The arm 110 can be supported by a base 112, and the base 112 can be supported on the same frame 40 as the platen 24. The base 112 can include one or more an actuators, e.g., a linear actuator to raise or lower the arm 110, and/or a rotational actuator to swing the arm 110 laterally over the platen 24. The arm 110 is positioned to avoid colliding with other hardware components such as the polishing head 70 and the slurry dispensing arm 39.

The example cooling system 120 includes multiple nozzles, e.g., a linear array of nozzles (e.g., nozzle 128 and nozzle 148) suspended by the arm 110. Each nozzle is configured to spray a medium, e.g., gas or liquid, onto the polishing pad 30 to modify a temperature in a radial zone, e.g., radial zones 129 and 149. In some implementations, the medium can be water, such as substantially pure de-ionized water, or water that includes additives or chemicals. For example, the nozzle 128 can be configured to direct aerosolized water in a spray 114 toward the polishing pad 30 and onto the zone 129 as the polishing pad 30 rotates about the axis 25. The zone 129 is concentric with the axis of rotation of the polishing pad 30, and can be 0.5 to 20 cm wide, e.g., 3 to 10 cm wide.

The arm 110 can be supported by a base 112 so that the nozzle 128 is separated from the polishing pad 30 by a gap 116. The gap 116 can be increased or decreased as the base 112 is raised or lowered. For example, the gap between the nozzle 128 and the polishing pad 30 can be 0.5 to 100 mm, e.g., 0.5 to 5 mm for a nozzle 128 dispensing heated fluid, or 5 to 10 cm for a nozzle 128 dispensing cooled fluid. 0.5 mm to 100 mm. That is, nozzles for the heated medium can be closer to the pad than the nozzles for the cool fluid. Similarly, the nozzle 148 can be configured to direct a spray 114 onto the zone 149.

The temperature of the medium flowing through each nozzle 128, 148 can be independently controlled. For example, there can be separate sources 122, 124 and 142, 144 of coolant medium and heating medium, respectively, and the ratio of fluid flow to a nozzle can control the temperature of the medium, e.g., by use of valves. Alternatively, temperature of the medium could be controlled by a heat exchanger before the nozzle.

In addition, the temperature control system 120 can include gas medium source 122, 142 and liquid medium source 124, 1 (see FIG. 2A). Gas from the source 122, 142 and liquid from the source 124, 144 can be mixed in a mixing chamber 126 (see FIG. 1), e.g., in or on the arm 110, before being directed through the nozzle 128 to form the spray 114.

Gas medium 122 and liquid medium 124 can be used for cooling. For cooling, the medium can be a gas, e.g., air, or a liquid, e.g., water. In some implementations, the nozzle ejects an aerosolized spray of water that is chilled below room temperature. Gas medium 142 and liquid medium 144 can be used for heating. For heating, the medium can be a gas, e.g., steam or heated air, or a liquid, e.g., heated water, or a combination of gas and liquid. In some implementations, the nozzle ejects a spray of steam to heat a zone of the polishing pad 30.

In some implementations, solid material can be mixed with the gas and/or liquid. The solid material can be a chilled material, e.g., ice, or a material that absorbs heat, e.g., by chemical reaction, when dissolved in water.

In some implementations, a process parameter, e.g., flow rate, pressure, and/or mixing ratio of liquid to gas, can be independently controlled for each nozzle 128.

Although FIGS. 1 and 2A-2B illustrates two nozzles 128, 148, there could be a larger or smaller number of nozzles, e.g., one to ten nozzles forming one to ten zones. The nozzles can be distributed uniformly or non-uniformly, radially, and/or angularly.

While FIG. 2 illustrates one arm for the temperature control system 100, the functionality of heating and cooling could be split into a cooling system 120 and a separate heating system 140. In some implementations the various subsystems can be included in separate assemblies supported by a separate arms. For example, a first assembly can include a cooling module and a second assembly can include a heating module. Each module can include a body, e.g., a straight or an arcuate body, that can be secured to a common mounting plate (e.g., the frame 40), and the common mounting plate can be secured at the end of an arm so that the assembly is positioned over the polishing pad 30. Various fluid delivery components, e.g., tubing, passages, etc., can extend inside each body. In some implementations, the modules are separately detachable from the mounting plate. Each module can have similar components to carry out the functions of the arm of the associated system described above.

While two zones (zone 129 and zone 149) are illustrated in FIGS. 1 and 2, there can be less zones (e.g., one zone that is either heated or cooled), and there can be more than two zones with independently controlled temperatures. For example, there can be a number of temperature zones where each zone can be progressively cooler or hotter than the next zone (e.g., the outermost zone is the coolest, the innermost zone is the hottest, and each zone in-between progressively heats up from the outermost zone to the innermost zone).

The polishing system 20 can also include a controller 90 to control operation of various components, e.g., the temperature control system 100. The controller 90 is configured to receive the temperature measurements from the temperature sensor 64 for each radial zone of the polishing pad. The controller 90 can compare the measured temperature profile to a desired temperature profile, and generate a feedback signal to a control mechanism (e.g., actuator, power source, pump, valve, etc.) for each nozzle. The feedback signal is calculated by the controller 90, e.g., based on an internal feedback algorithm, to cause the control mechanism to adjust the amount of cooling or heating of each zone such that the polishing pad and/or slurry reaches (or at least moves closer to) the desired temperature profile.

The controller 90 can direct the nozzle 128 to spray an outer radial concentric zone 129 with liquid and/or gas medium to bring the zone 129 to a desired temperature (for example, a cooled zone) as the polishing pad 30 rotates about the axis 25. Similarly, the controller 90 can direct the nozzle 148 to spray an inner radial concentric zone 149 (for example, a heated zone) with liquid and/or gas medium to bring the zone 149 to a desired temperature as the polishing pad 30 rotates about the axis 25. The temperature sensor 64 can continue to measure the temperature of the polishing pad 30, for example, by measuring the portion of the pad 30 that corresponds to the cooled zone 129 and/or the heated zone 149, until a desired temperature profile across the polishing pad 30 is achieved.

When the temperature of the interface between the pad 30 and substrate 10 is decreased, the effect is that the polishing rate is decreased. Conversely, when the temperature of the interface between the pad and the substrate 10 is increased, the effect is that the polishing rate is increased.

For example, decreasing the temperature of the interface between the pad 30 and the substrate 10 at the zone 129 decreases the polishing rate at the zone 129. Also, increasing the temperature of the interface between the pad 30 and the substrate 10 at the zone 149 increases the polishing rate at the zone 149. By decreasing and/or increasing the polishing rates at different zones, a non-uniform polishing profile is created. Creating temperature non-uniformity in the polishing profile provides different polishing rates that can generate a desired profile of the substrate 10. The non-uniform polishing profile can be used to address and compensate for the non-uniformity that results from the substrate 10 being polished without the temperature control system 100.

In some implementations, the non-uniform polishing profile can be used to address and compensate for the substrate 10 that has a non-uniform profile prior to polishing. For example, a non-uniform substrate 10 with an edge portion that is thinner than the rest of the substrate 10 can be positioned over the zone 129 to reduce removal (e.g., by being positioned over a zone 129 that has a reduced polishing rate) of the thinner edge of the substrate 10. Alternatively, a non-uniform substrate 10 with an edge portion that is thicker than the rest of the substrate 10 can be positioned the zone 149 to increase removal (e.g., by being positioned over a zone 149 that has an increased polishing rate) of the thicker edge of the substrate 10. The result would be a more uniform substrate 10 profile.

In some implementations, a non-uniform substrate 10 profile is desired. As such, the substrate 10 can be polished above different zones (e.g., zone 129 and/or zone 149) to decrease and/or increase the removal of the portions of the substrate 10 that overlie the different zones of different temperatures to achieve a desired non-uniform substrate 10.

In some implementations, even if there is temperature uniformity across the polishing pad 30, chemical mechanical polishing of the substrate 10 can still result in a non-uniform substrate 10. For example, even assuming a uniform temperature profile of the polishing pad 30, the edge portion of the substrate 10 can be polished at a higher rate than the central portion of the substrate 10. To compensate for the non-uniform polishing, the temperature of different zones of the polishing pad 30 (e.g., the zone 129 and/or the zone 149) can be decreased or increased to provide a desired substrate 10 profile. For example, if the edge portion of the substrate 10 is polished at a higher rate than the central portion of the substrate 10, the edge portion of the substrate 10 can be positioned over the zone 129, which can be at a decreased temperature relative to the rest of the polishing pad 30. This would reduce the polishing rate at the edge portion of the substrate 10, and result in a more uniform profile for substrate 10.

In some implementations, the substrate 10 has an asymmetric thickness non-uniformity, where different angular portions of the substrate 10 have different thicknesses. For example, a first edge portion of the substrate 10 may be thinner than a second edge portion of the substrate 10. If a uniform substrate 10 is desired, simply positioning the edge portions of the substrate 10 over a zone (e.g., the zone 129, the zone 149) may not be sufficient.

To compensate for edge asymmetry in the substrate 10, the controller 90 can cause the motion of the carrier head 70 to carry the different edge portions over different temperature zones of the polishing pad 30. This can be done by synchronizing oscillation of the carrier head 70 with rotation of the carrier head 70, or by synchronization of the rotation of the carrier head 70 with rotation of the platen 24.

The substrate 10 can have a first angular swath 127 and a second angular swath 147, each with different thicknesses. When the first angular swath 127 of the substrate 10 is at a given azimuthal angular position 12 about the axis of rotation 71 of the carrier head 70, the carrier head 70 can position the first angular swath 127 to overlie the first zone (e.g., the zone 129). As the carrier head rotates the second angular swath 147 moves toward the given azimuthal angular position. When the second angular swath 147 of the substrate 10 is at the given azimuthal angular position 12 about the axis of rotation 71 of the carrier head 70, the carrier head 70 can position the second angular swath 147 to overlie the second zone (e.g., the zone 149). The azimuthal angular position 12 can be the position farthest from the axis of rotation 25 of the polishing pad. Similarly, the azimuthal angular position 12 can be on a line that passes through the axis of rotation 25 of the polishing pad 30 and the axis of rotation 71 of the carrier head 70.

For example, as shown in FIG. 2A, if the first angular swath 127 of the substrate 10 is thin relative to other portions of the substrate 10, the controller 90 can synchronize the lateral motion of the carrier head 70 (shown by Arrow A) and the rotation of the carrier head 70 (shown by Arrow B) so the first angular swath 127 overlies the zone 129, where the zone 129 is at a first temperature that reduces the polishing rate. The result is the first angular swath 127 is polished at a lower rate. This can provide a more uniform substrate 10. Similarly, as shown in FIG. 2B, if the second angular swath 147 of an edge portion of the substrate 10 is thick relative to other portions of the substrate 10, the controller 90 can synchronize the lateral motion of carrier head 70 and the rotation of the carrier head 70 so the second angular swath 147 overlies the zone 149, where the zone 149 is at a second temperature that increases the polishing rate. The result is the second angular swath 147 is polished at a higher rate, and provides a more uniform substrate 10.

Although two angular swaths 127, 147 are illustrated in FIGS. 2A and 2B, this technique can be scaled up to handle more angular swaths with different thicknesses.

Figure 3A:
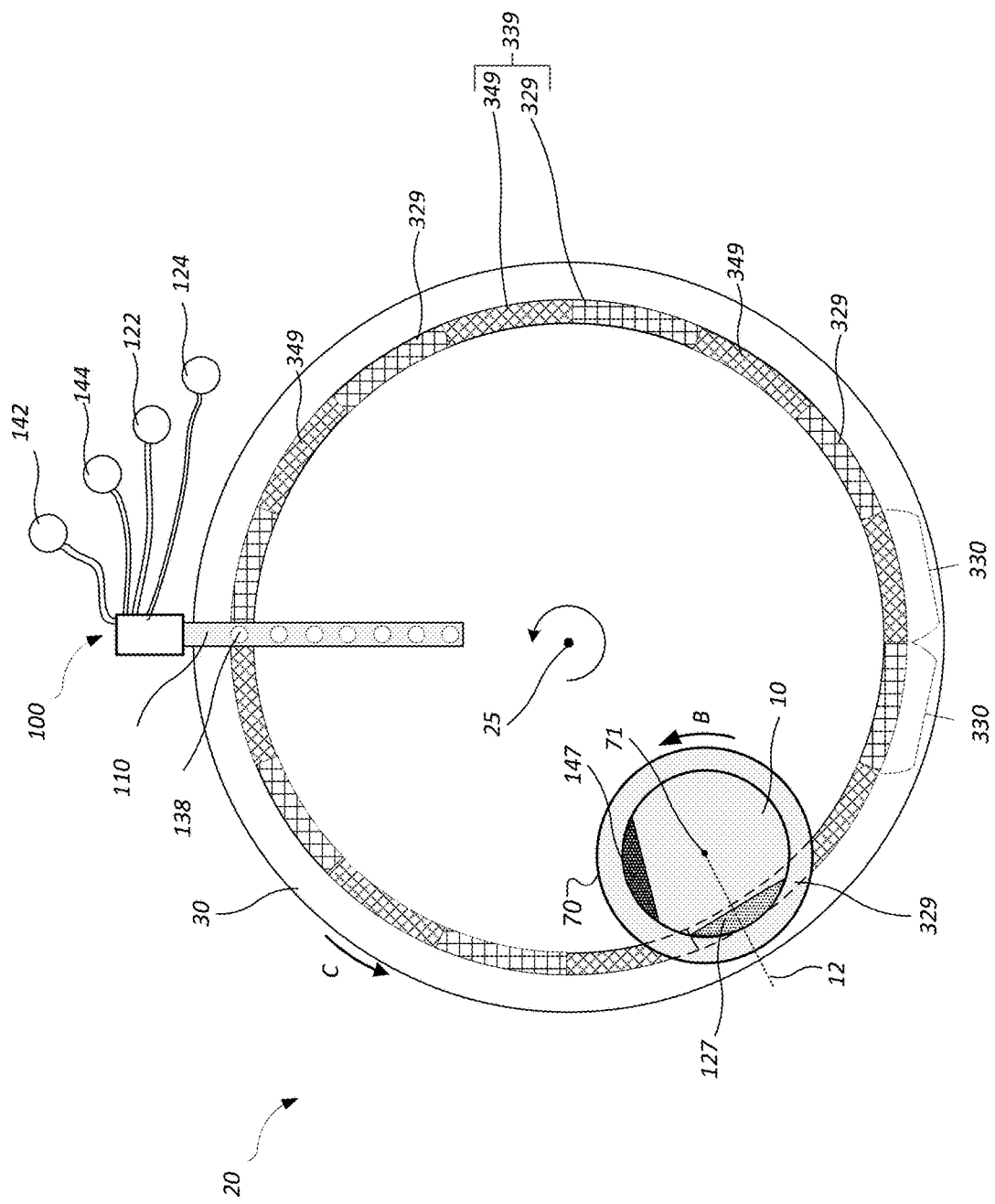
FIGS. 3A and 3B illustrate schematic top views of an example chemical mechanical polishing apparatus.
Figure 3B:
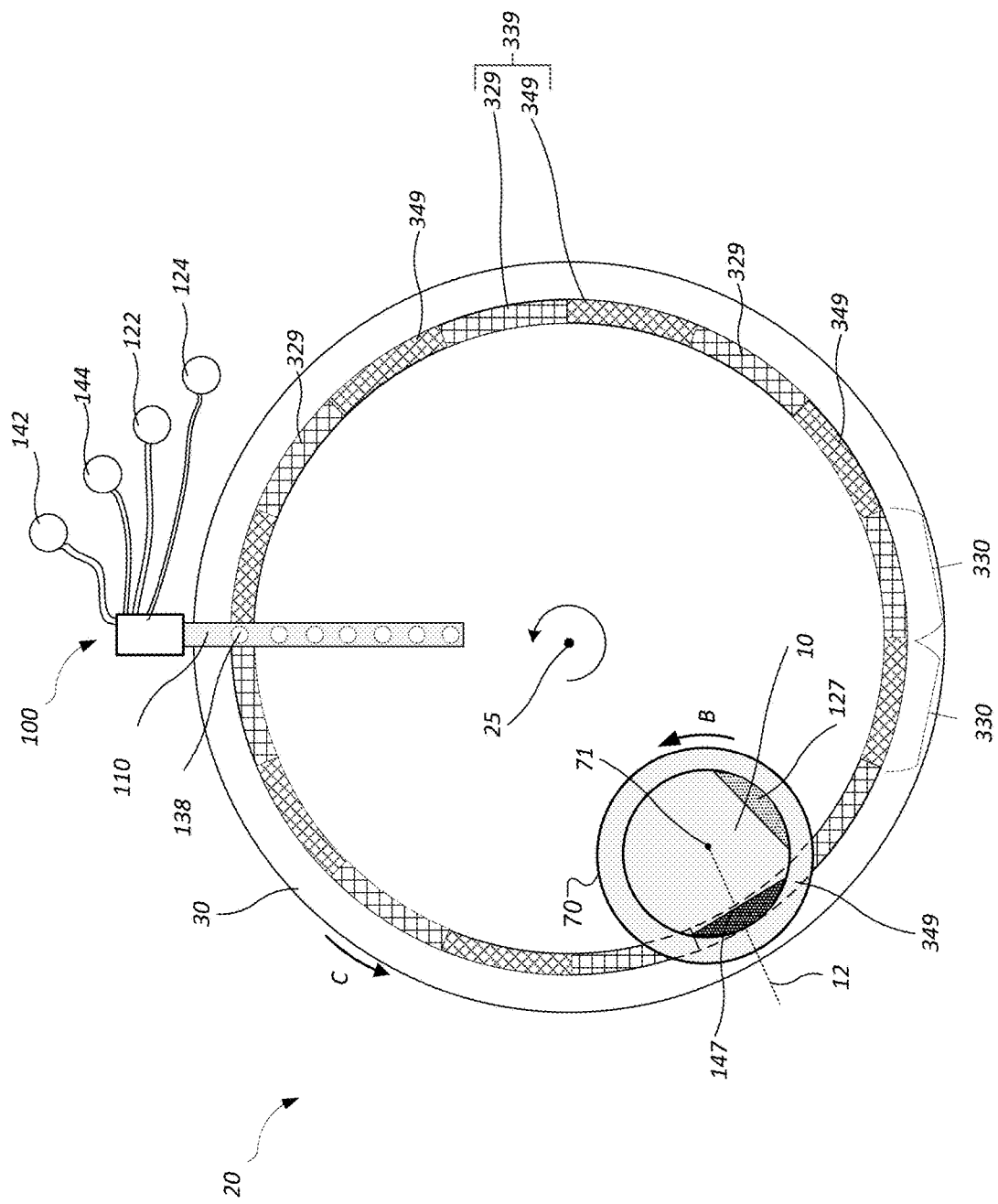

Referring now to FIGS. 3A and 3B, a polishing station 20 can include a polishing pad 30 where the temperature of a mixed temperature zone 339 is controlled. The mixed temperature zone 339 includes regions 329 and 349 that can be set to different temperatures. For example, the zone 339 can include both a region 329 at a first temperature and a region 349 at a second temperature.

The mixed temperature zone 339 can alternate between arcuate segments 330 of regions 329 at a first temperature and arcuate segments 330 of regions 349 at a different second temperature. In brief, the regions 329, 429 can be generated by the temperature control system 100 alternating between heating and cooling the zone 339 (or by alternating between two different rates of heating or two different rates of cooling) as the polishing pad 30 rotates. There can be anywhere between two and ten segments 330 within the mixed temperature zone 339.

The temperature of the segments 330 comprising the mixed temperature zone 339 can be independently controlled. For example, a nozzle 138 can be directed to spray various cooling and heating media (e.g., coolants from the gas medium source 122 and/or the liquid medium source 124, and heating media from the gas medium source 142 and/or the liquid medium source 144) to achieve a desired temperature profile of the mixed temperature zone 339.

In some implementations, the nozzle 138 can spray different segments 330 of the mixed temperature zone 339 to have two alternating temperatures. As illustrated in FIGS. 3A and 3B, the mixed temperature zone 339 can have alternating segments 330 with regions 329 that are at a first temperature, and regions 349 that are at a second temperature. For example, the regions 329 can be sprayed with a coolant medium, whereas the regions 349 are sprayed with a heating medium, creating an alternating pattern of cooling regions 329 and heating regions 349.

Although one arm 110 is illustrated, additional arms can be used to maintain a desired temperature profile on the polishing pad 30. Additionally, while one mixed temperature zone 339 is illustrated, additional nozzles 138 can form additional mixed temperature zones on the polishing pad 30.

The controller 90 can cause the motion of the carrier head 70 to carry the different edge portions of the substrate 10 over different segments 330 of the mixed temperature zone 339 of the polishing pad 30, where regions 329 and 349 in each segment 330 can be set to different temperatures. This can be done by synchronizing rotation of the carrier head 70 with rotation of the platen 24 in conjunction with the timing of the application of heating or cooling by the temperature control system 100.

The substrate 10 can have a first angular swath 127 and a second angular swath 147, each with different thicknesses. When the first angular swath 127 of the substrate 10 is at a given azimuthal angular position 12 about the axis of rotation 71 of the carrier head 70, the carrier head 70 can position the first angular swath 127 to overlie the first region (e.g., the region 329). As the carrier head rotates the second angular swath 147 moves toward the given azimuthal angular position. When the second angular swath 147 of the substrate 10 is at the given azimuthal angular position 12 about the axis of rotation 71 of the carrier head 70, the carrier head 70 can position the second angular swath 147 to overlie the second region (e.g., the region 349). The azimuthal angular position 12 can be the position farthest from the axis of rotation 25 of the polishing pad. Similarly, the azimuthal angular position 12 can be on a line that passes through the axis of rotation 25 of the polishing pad 30 and the axis of rotation 71 of the carrier head 70.

For example, as shown in FIG. 3A, if the first angular swath 127 of the substrate 10 is thin relative to other portions of the substrate 10, the controller 90 can synchronize the rotation of the carrier head 70 (shown by Arrow B) and the rotation of platen 24 and the polishing pad 30 (shown by Arrow C) so the first angular swath 127 overlies the region 329, where the region 329 is at a first temperature that reduces the polishing rate. The result is the first angular swath 127 is polished at a lower rate. This can provide a more uniform substrate 10. Similarly, as shown in FIG. 3B, if the second angular swath 147 of an edge portion of the substrate 10 is thick relative to other portions of the substrate 10, the controller 90 can synchronize the rotation of carrier head 70 and the rotation of the polishing pad 30 so the second angular swath 147 overlies the region 349, where the region 349 is at a second temperature that increases the polishing rate. The result is the second angular swath 147 is polished at a higher rate, and provides a more uniform substrate 10. The carrier head need not sweep laterally in this technique; this could provide a simpler calculation for coordinating the regions of different temperatures with the swaths of the substrate.

Although two angular swaths 127, 147 are illustrated in FIGS. 3A and 3B, this technique can be scaled up to handle more angular swaths with different thicknesses.

The embodiments described above include an arm having multiple nozzles to supply heating or cooling fluids to different zones on the polishing pad. Thus, each nozzle can have a dedicated zone on the polishing pad.

Figure 4:
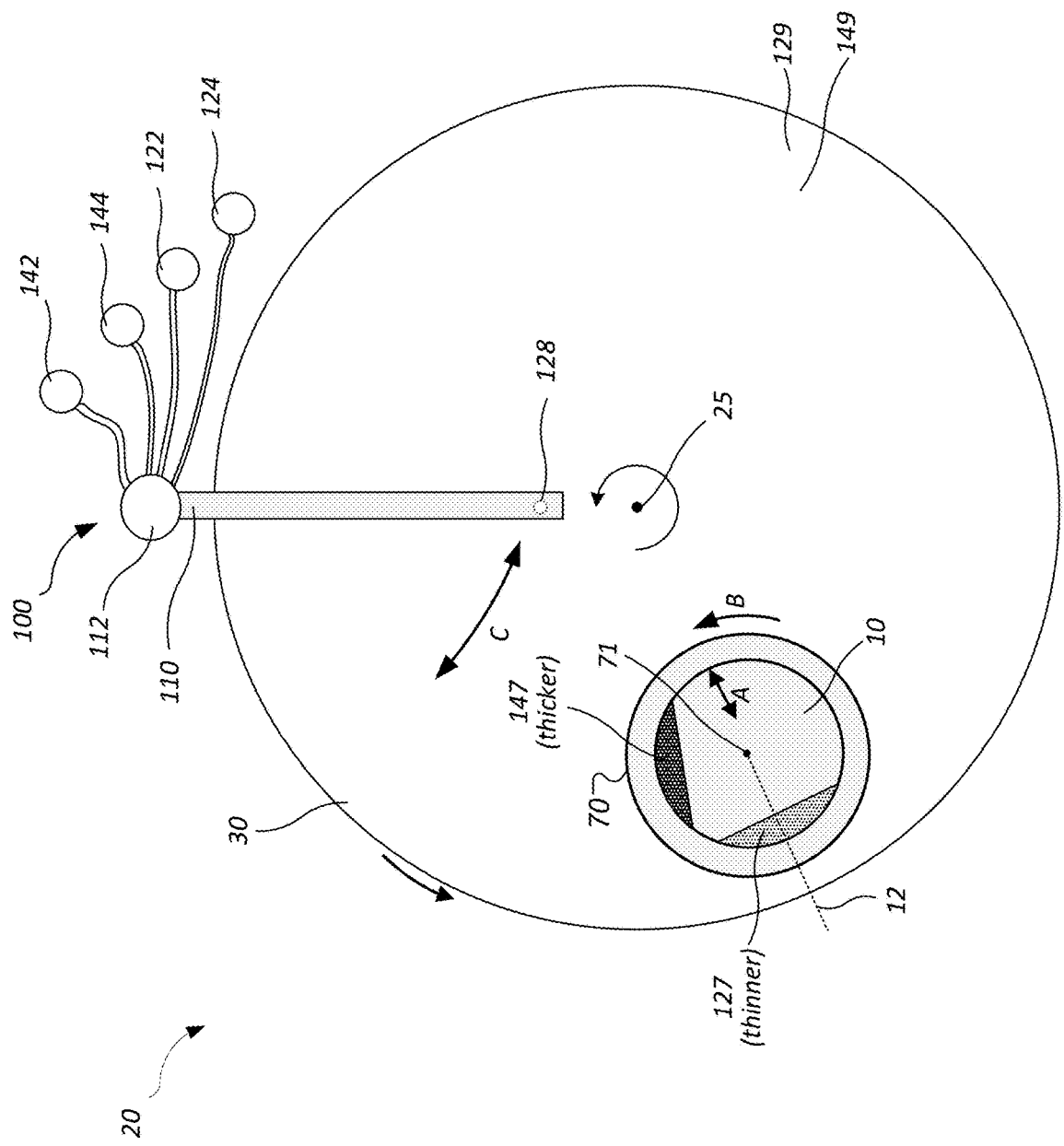
FIG. 4 illustrates a schematic top view of another example chemical mechanical polishing apparatus.

In contrast, as shown in FIG. 4, the nozzle could be movable across the polishing pad. For example, the arm 110 could have a single nozzle 128, and the arm 110 could move to radially position the nozzle relative to the axis of rotation of the platen so as to provide heating or cooling at a selectable position. For example, the arm 110 could extend from a rotatable base 120 so that the end of the arm 110 can sweep radially (shown by arrow C) relative to the axis of rotation 25 of the platen. As another example, the arm 110 could have a linear actuator so that the arm can extend and retract. As another example, the arm 110 could be fixed in position, and the nozzle 128 could be movable on the arm, e.g., by a linear actuator. For example, the nozzle 128 could suspended from a rack and pinion arrangement. In any of these cases, appropriate timing of the dispensing of the heated or cooled fluid onto the polishing pad can establish one of the temperature profiles discussed previously.

In addition, although the embodiments above discuss multiple zones on the polishing pad that are heated and cooled, there can be just zones that are heated or just zones that are heated (with the remainder of the polishing pad, e.g., other zones on the polishing pad, having a temperature controlled by other ambient or environmental effects). Moreover, Although the embodiments above discuss multiple zones on the polishing pad, there could be just a single zone that is heated or cooled.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. The polishing layer can be a standard (for example, polyurethane with or without fillers) polishing material, a soft material, or a fixed-abrasive material.

Terms of relative positioning are used to refer to relative positioning within the system or substrate; it should be understood that the polishing surface and substrate can be held in a vertical orientation or some other orientation during the polishing operation.

Functional operations of the controller 90 can be implemented using one or more computer program products, i.e., one or more computer programs tangibly embodied in a non-transitory computer readable storage media, for execution by, or to control the operation of, data processing apparatus, e.g., a programmable processor, a computer, or multiple processors or computers.

A number of embodiments of the invention have been described. Nevertheless, it will be understood that various modifications may be made without departing from the spirit and scope of the invention.

For example, although the description above focuses on delivering the heating and/or cooling medium onto the polishing pad, the heating and/or cooling medium could be delivered onto other components to control the temperature of those components. For example, a heating and/or cooling medium could be sprayed onto the substrate while the substrate is positioned in a transfer station, e.g., in a load cup. As another example, the load cup itself could be sprayed with the heating and/or cooling medium. As yet another example, the conditioning disk could be sprayed with the heating and/or cooling medium.

Accordingly, other embodiments are within the scope of the following claims.

What is claimed is:

1. A chemical mechanical polishing apparatus comprising:
   a rotatable platen to hold a polishing pad;
   a rotatable carrier to hold a substrate against a polishing surface of the polishing pad during a polishing process;
   a first actuator to oscillate the carrier across the polishing pad;
   a polishing liquid supply port to supply a polishing liquid to the polishing surface;
   a thermal control system including a movable nozzle to spray a medium onto the polishing surface to adjust a temperature of a zone on the polishing surface;
   a second actuator to move the nozzle radially relative to an axis of rotation of the platen; and
   a controller configured to coordinate dispensing of the medium from the nozzle with motion of the nozzle across the polishing surface to generate a plurality of radial annular zones of different temperatures and to synchronize oscillation of the carrier with rotation of the carrier to periodically align one or more angular swaths of the substrate with one of the radial annular zones.

2. The apparatus of claim 1, wherein the controller is configured to coordinate dispensing of the medium so as to reduce angular asymmetrical polishing of the substrate.

3. The apparatus of claim 1, wherein the medium is a heated gas.

4. The apparatus of claim 1, wherein the medium is a cooled liquid.

5. The apparatus of claim 1, wherein the nozzle is suspended from an arm and the arm is supported by a rotatable base so as to pivot the arm over the polishing surface.

6. The apparatus of claim 1, wherein the nozzle is suspended from an arm and the arm is extendable and retractable by an actuator.

7. The apparatus of claim 1, wherein the nozzle is suspended from and linearly movable along an arm, and comprising an actuator to move the nozzle along the arm.

8. The apparatus of claim 1, wherein the controller is configured to cause actuator to move the nozzle and cause the nozzle to dispense the medium in coordination to generate a first and second zones that are different temperature and that are concentric rings about an axis of rotation of the platen and that are different temperature.

9. The apparatus of claim 1, wherein the controller is configured to cause the nozzle to dispense the medium to generate first and second regions that are different temperatures and that are arcuate segments along a ring that is concentric ring about an axis of rotation of the platen.

10. The apparatus of claim 1, wherein a gap between the nozzle and the polishing surface is adjustable.

11. A chemical mechanical polishing apparatus comprising:
    a platen to hold a polishing pad;
    a rotatable carrier to hold a substrate against a polishing surface of the polishing pad during a polishing process;
    a thermal control system including a movable nozzle to spray a medium onto the polishing surface to adjust a temperature of the polishing surface; and
    a controller configured to coordinate dispensing of the medium with motion of the polishing pad to generate a plurality of arcuate segments of different temperature and to synchronize rotation of the carrier with rotation of the platen to periodically align one or more angular swaths of the substrate with one of the arcuate segments.

12. The apparatus of claim 11, wherein the thermal control system includes a movable nozzle to spray a medium onto the polishing surface.

13. The apparatus of claim 11, wherein the medium is a heated gas.

14. The apparatus of claim 11, wherein the medium is a cooled liquid.

* * * * *